(12) United States Patent
Jacobs et al.

(10) Patent No.: US 7,019,544 B1
(45) Date of Patent: *Mar. 28, 2006

(54) TRANSMISSION LINE INPUT STRUCTURE TEST PROBE

(75) Inventors: Lawrence W. Jacobs, Beaverton, OR (US); Julie A. Campbell, Beaverton, OR (US)

(73) Assignee: LeCroy Corporation, Chestnut Ridge, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 10/995,801

(22) Filed: Nov. 22, 2004

Related U.S. Application Data

(63) Continuation-in-part of application No. 10/261,829, filed on Sep. 30, 2002, now Pat. No. 6,822,463.

(60) Provisional application No. 60/342,974, filed on Dec. 21, 2001.

(51) Int. Cl.
*G01R 27/08* (2006.01)

(52) U.S. Cl. ...................... 324/715; 324/72.5

(58) Field of Classification Search ............... 324/715
See application file for complete search history.

(56) References Cited

U.S. PATENT DOCUMENTS

| | | | |
|---|---|---|---|
| 3,532,982 A | 10/1970 | Zeidlhack et al. | |
| 3,870,953 A | 3/1975 | Boatman et al. | |
| 4,055,805 A | 10/1977 | Ardezzone | |
| 4,132,946 A | 1/1979 | Holdren et al. | |
| 4,195,258 A | 3/1980 | Yen | |
| 4,574,235 A | 3/1986 | Kelly et al. | |
| 4,740,746 A | 4/1988 | Pollock et al. | |
| 4,743,839 A | 5/1988 | Rush | |
| 4,856,023 A | 8/1989 | Singh | |
| 4,908,576 A | 3/1990 | Jackson | |
| 4,923,407 A | 5/1990 | Rice et al. | |
| 5,115,200 A | 5/1992 | Lahitte et al. | |
| 5,287,065 A | 2/1994 | Allfather | |
| 5,386,197 A | 1/1995 | Saito | |
| 6,201,459 B1 | 3/2001 | Ioffe et al. | |
| 6,276,956 B1 | 8/2001 | Cook | |
| 6,307,363 B1 | 10/2001 | Anderson | |
| 6,307,389 B1 | 10/2001 | Buks et al. | |
| 6,483,284 B1 | 11/2002 | Eskeldson et al. | |
| 6,670,830 B1 | 12/2003 | Otsuka et al. | |
| 6,688,906 B1 | 2/2004 | Kimbley | |
| 6,704,670 B1 | 3/2004 | McTigue | |

OTHER PUBLICATIONS

P6511/P6513/P6515/P6517, Tek Spring Contact Fixtured Probes, Tektronix Catalog, 1989.

Digital Signal Transmission, Digital Circuits and Systems, 1989, pps. 292-297, McGraw-Hill, Inc., United States.

Agilent Technologies, "Agilent EPM Series Power Meters E-Series and 8480 Series Power Sensors Data Sheet," at least as early as Oct. 24, 2003, pp. 1-22, www.agilent.com.

*Primary Examiner*—Anjan Deb
*Assistant Examiner*—Timothy J. Dole
(74) *Attorney, Agent, or Firm*—Law Office of Karen Dana Oster, LLC

(57) ABSTRACT

A differential electrical test probe tip for sensing a plurality of electric signals and generating a differential signal including an elongate common substrate having a two signal test points at one end and a differential amplifier at the second end. Two transmission lines are on the common substrate, each connecting a respective signal test point a signal input of the differential amplifier. The characteristic impedances of the two transmission lines are substantially equal. In one preferred embodiment, the common substrate is a flexible substrate. In one preferred embodiment an over-mold, which may have gaps therein, at least partially encloses the common substrate, the first transmission line, and the second transmission line.

44 Claims, 11 Drawing Sheets

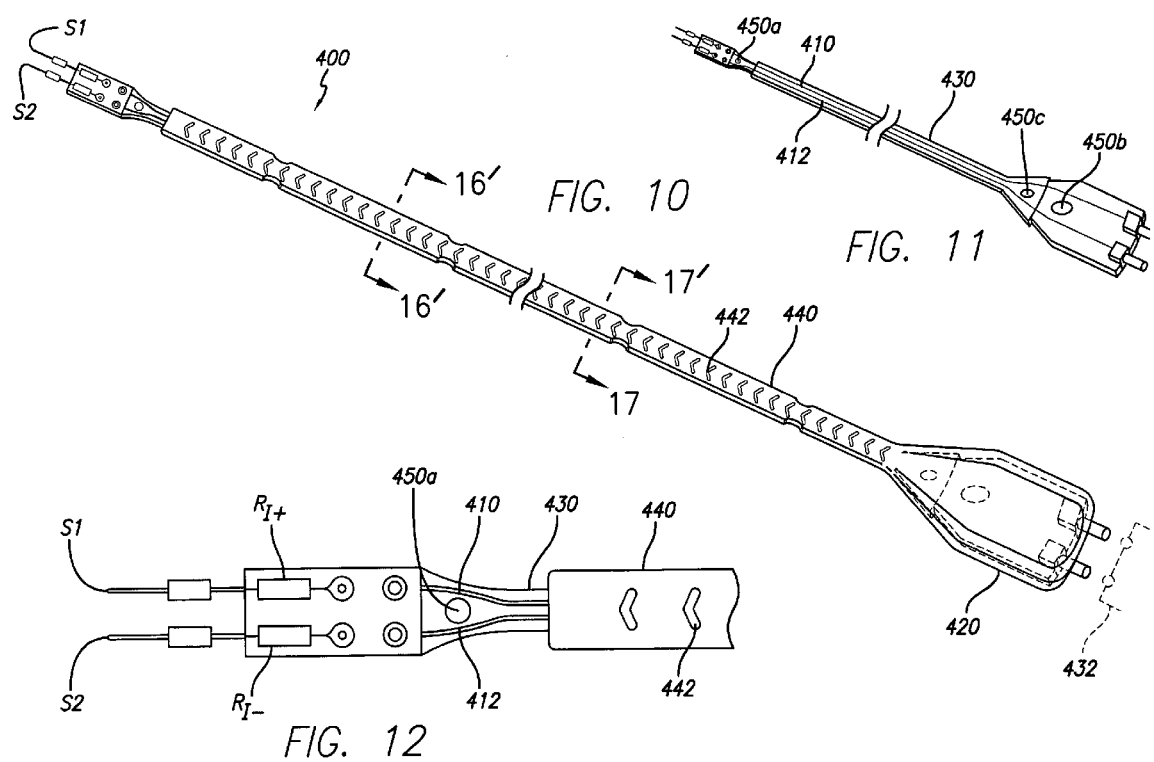

TRANSMISSION LINE INPUT STRUCTURE TEST PROBE

The present application is a continuation-in-part of U.S. patent application Ser. No. 10/261,829, U.S. Pat. No. 6,822,463 filed Sep. 30, 2002, which in turn claims the benefit under 35 USC Section 119(e) of U.S. Provisional Patent Application Ser. No. 60/342,974, filed Dec. 21, 2001. The present application is based on and claims priority from these applications, the disclosures of which are hereby expressly incorporated herein by reference in their entirety.

BACKGROUND OF INVENTION

The present invention relates to the field of electrical test probes. More particularly, the present invention relates to an active differential test probe with a transmission line input structure.

An electrical signal will change when a test instrument, such as an oscilloscope, is connected to the circuit that generates the signal. For example, if a bare wire is connected between a circuit and an oscilloscope, the wire and the input circuitry of the oscilloscope effectively add a load resistance and a shunt capacitance to the circuit. This reduces the measured voltage and affects measurements of dynamic timing characteristics, such as pulse rise time. For this reason, a test probe that minimizes the loading effects on the circuit is generally used when a test instrument is connected to a circuit. Several general types of test probes have been developed.

With a high-impedance test probe, it is possible to take a small sample of the signal without appreciably loading the circuit being measured. A high-impedance test probe consists of a large value resistor and an input capacitor coupled, in parallel, to a test point in the circuit. A high-impedance test probe, however, is not suited for high-frequency measurements because of the relatively high value of its input capacitance.

A low-impedance test probe is better suited for measurement of high frequency signals. A low-impedance test probe consists of a low-value input resistor in series with the signal conductor of a low-loss coaxial cable that is treated as a terminated transmission line. One limitation of the low-impedance test probe is that it may be used only at a test point with a relatively low source resistance. Another disadvantage is that the low-impedance test probe is a single ended test probe. An additional limitation of the low-impedance test probe is that the frequency is limited to the resonant frequency of the probe input capacitance in series with the ground lead inductance.

An active test probe represents another approach for obtaining accurate measurements of high frequency signals. An active test probe includes a resistive/capacitive divider network coupled between a test point and an amplifier with a high input impedance. One limitation of the active test probe, however, is that it is not possible to design an amplifier with the required high input impedance at very high frequencies. Another limitation of the active test probe is that high frequency signals can be distorted because of electromagnetic wave reflection. This signal distortion results from the fact that as frequency increases, the input structure becomes large with respect to the electrical wavelength.

The active test probe design has additional limitations when it is used in differential test probes. A differential test probe measures two signals and outputs a third signal representing the difference between the first signal and the second signal. An active differential test probe consists of two resistive/capacitive divider networks, one for each signal to be measured, and a differential amplifier. To function properly the two divider networks of the differential test probe must be accurately matched. In practice, however, the difficulty of properly matching the two divider networks can be a significant limitation. Another limitation is that high frequency signal distortion from electromagnetic wave reflection can be a significant problem when sampling two spaced-apart test points. In this situation, it may be physically impossible to keep the input structures small with respect to the electrical wavelength.

As mentioned above, a differential probe measures the difference between two input signals. For this purpose, two probe tips are needed. Most prior art dual tip systems are plug-in devices. In order to adjust the distance between the two tips, the tips are able to slide or swivel. The problem with these systems is that the tips often slide or swivel by themselves when the user does not want them to move.

Accordingly, there is a need for an active differential test probe with a transmission line input structure that does not require a high impedance amplifier, matched input networks, and small input structures.

BRIEF SUMMARY OF THE INVENTION

The present invention is directed to a differential electrical test probe tip for sensing a plurality of electric signals and generating a differential signal. The differential electrical test probe tip includes an elongate common substrate having a two signal test points at one end and a differential amplifier at the second end. Two transmission lines are on the common substrate, each connecting a respective signal test point a signal input of the differential amplifier. The characteristic impedances of the two transmission lines are substantially equal. In one preferred embodiment, the common substrate is a flexible substrate. In one preferred embodiment an over-mold, which may have gaps therein, at least partially encloses the common substrate, the first transmission line, and the second transmission line.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 10 is a top perspective view of one preferred embodiment of a probe tip having matched transmission lines on a common substrate that may be flexible enclosed in an over-mold.

FIG. 11 is a top perspective view of matched transmission lines on a common substrate that may be flexible.

FIG. 12 is an enlarged top view of the front-most portion of a first exemplary probe tip of FIG. 10.

DETAILED DESCRIPTION OF THE INVENTION

The present invention is directed to an active differential test probe with a transmission line input structure. The test probe of the present invention is advantageously described with reference to prior art test probes. FIGS. 2–5 depict several prior art test probes. FIGS. 6–9 are circuit diagrams of exemplary test probes of the present invention. FIGS. 10–18 show one preferred embodiment of matched transmission lines for a probe tip on a common substrate that may be flexible.

Figure 1:
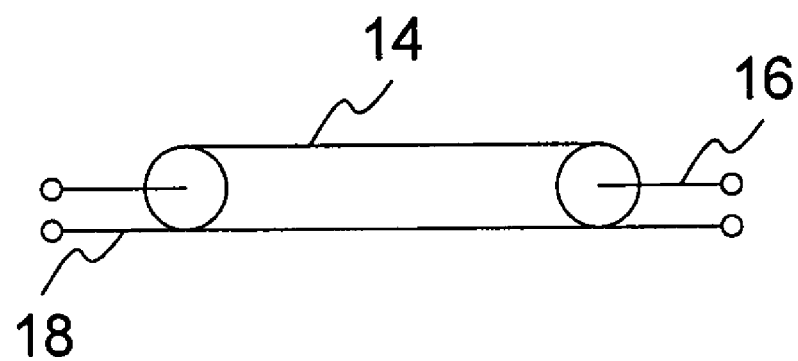
FIG. 1 is a circuit diagram of an exemplary prior art transmission line.

Throughout this application, reference is made to the signal conductor and the ground conductor of various transmission lines. FIG. 1 is a circuit diagram that illustrates an exemplary transmission line 14. The exemplary transmission line 14 includes a signal conductor 16 and a ground conductor 18. FIG. 1 illustrates how the signal conductor and the ground conductor of a transmission line are depicted in the remaining figures. As will be apparent to one skilled in the art, however, the transmission line may be a printed transmission line (e.g. microstrip or strip line), coaxial cable, or any structure that has a constant impedance. It should be noted, however that although there are known transmission lines that have been implemented on flexible substrates, matched transmission lines for a probe tip have never been implemented on a common substrate. There are significant advantages, as will be discussed, that are unique to matched transmission lines on a common substrate. For example, using matched transmission lines on a common substrate insures that the two conductors are physically identical in length and that there will be an excellent match of electrical length. Further, the specific application of using matched transmission lines on a common substrate between the two input points and the differential amplifier is not only unique, but allows for the much desired configuration of having a very small point of contact because the differential amplifier is distanced from the point of contact.

The exemplary transmission line 14 of FIG. 1 includes two or more parallel conductors 16, 18 (e.g. parallel wires, parallel plates, a coaxial line, a strip line, or other structure with two or more conductors within which electromagnetic waves can be guided). A typical transmission line has a signal conductor 16 and a ground conductor 18. A lossless transmission line has a characteristic impedance that has a fixed value irrespective of the length of the line. A low-loss transmission line can be used to approximate the properties of a lossless transmission line. At high frequency, signals can be distorted as the result of electromagnetic wave reflection. If a transmission line is terminated with its characteristic impedance, the distortion due to signal reflection can be eliminated.

Figure 2:
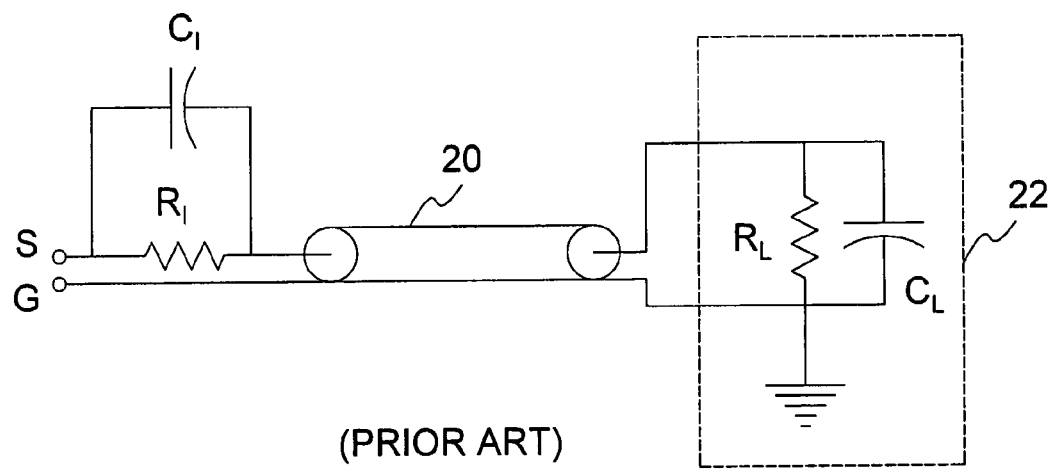
FIG. 2 is a circuit diagram of an exemplary prior art high-impedance test probe coupled to an exemplary test instrument.

FIG. 2 illustrates an exemplary prior art high-impedance test probe that consists of an input resistor $R_I$ and a compensating capacitor $C_L$ that are coupled, in parallel, to a signal test point S. The signal conductor of the transmission line 20 couples the resistor $R_I$ and the compensating capacitor $C_I$ to the signal input of a test instrument 22. In addition, the ground conductor of the transmission line 20 couples a signal ground point G to the ground input of the test instrument 22. The input circuitry of the test instrument 22 includes a resistor $R_L$ and a capacitor $C_L$ that are coupled in parallel between the signal input and the ground input of the test instrument 22. The input resistor $R_I$ and the resistance of the transmission line 20 form a voltage divider with resistor $R_L$.

The large value input resistor $R_I$ of the high-impedance test probe of FIG. 2 makes it possible to take a small sample of the signal without appreciably loading the circuit being measured. The input compensating capacitor $C_I$ compensates for the shunt capacitance in the oscilloscope input circuitry. While the high-impedance test probe allows a signal to be measured without loading down the circuit, it is not suited for high-frequency measurements because of the relatively high value of its input capacitance $C_I$. This is because the reactance of the input capacitor $C_I$ declines to zero at high frequencies (because capacitive reactance declines in inverse proportion to both signal frequency and the size of the capacitance).

Figure 3:
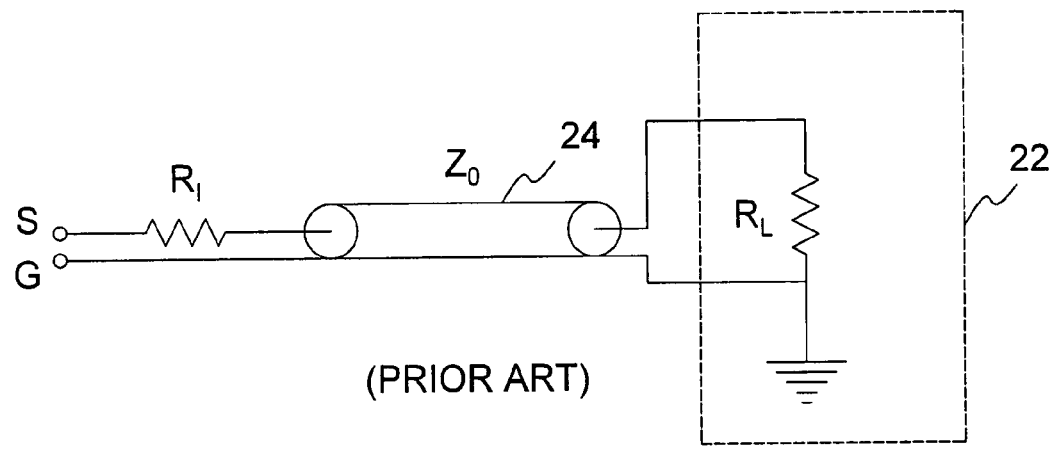
FIG. 3 is a circuit diagram of an exemplary prior art low-impedance test probe coupled to an exemplary test instrument.

FIG. 3 illustrates an exemplary prior art low-impedance test probe that consists of an input resistor $R_I$ in series with a low-loss transmission line 24 that is coupled to a test instrument 22. The input resistor $R_I$ is coupled to a signal test point S and the ground conductor of the cable 24 is coupled to a signal ground point G. The input circuitry of the test instrument 22 includes a termination resistor $R_L$. The cable 24 has a characteristic impedance $Z_0$ that is equal to the resistance of the termination resistor $R_L$.

The low-impedance test probe shown in FIG. 3 relies on the principle of terminated transmission line behavior to obtain accurate measurements of high frequency signals. The low-loss transmission line 24 shown in FIG. 3 is treated as a terminated transmission line. To terminate the transmission line 24, the low-impedance test probe must be used with a test instrument 22 that has an input termination resistor $R_L$ that matches the characteristic impedance of the transmission line 24. The low-impedance test probe also includes an input capacitance (not shown in the FIG. 3) that is inherent in the probe structure, but this capacitance is relatively small.

In a low-impedance test probe, if the value of the input resistor $R_I$ is sufficiently large with respect to the Thevenin equivalent source resistance of the circuit, a measurement of acceptable accuracy may be obtained. For example, a low-impedance test probe including a 450 ohm resistor $R_I$ and a 50 ohm transmission line 24 will produce acceptable measurements when coupled to a test point with a source resistance of 50 ohms. One limitation of the low-impedance test probe is that it may be used only at a test point with a relatively low source resistance. For example, under certain circumstances, if the source resistance of the circuit increases to only 120 ohms, the accuracy of the measured signal is significantly reduced and the circuit no longer operates correctly. As mentioned, the input capacitance of the low-impedance test probe is relatively small. This means that the input impedance does not fall off with increasing frequency as rapidly as with high-impedance probes. Eventually, however, the impedance of the low-impedance test probe does fall off with increasing frequency. Low-impedance test probes can be used successfully at considerably higher frequencies than high-impedance probes.

Figure 4:
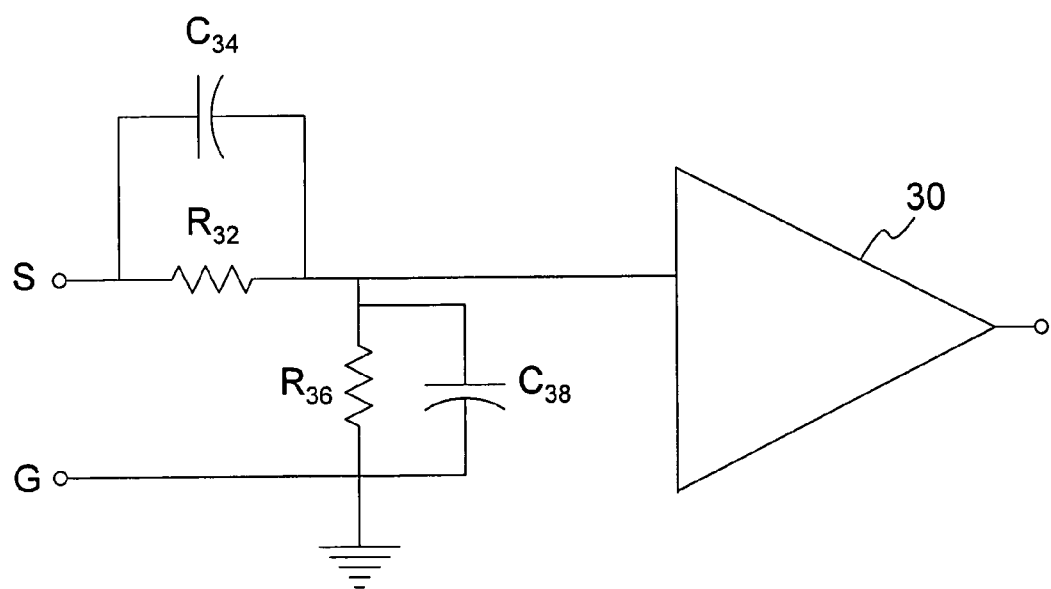
FIG. 4 is a circuit diagram of an exemplary prior art active test probe.

FIG. 4 illustrates an exemplary prior art active test probe that consists of a resistive/capacitive divider network coupled to an amplifier 30. The divider network includes a first resistor $R_{32}$ and a first capacitor $C_{34}$ coupled, in parallel, between a signal test point S and the input of the amplifier 30. The input network also includes a second resistor $R_{36}$ and a second capacitor $C_{38}$ coupled, in parallel, to the input of the amplifier 30 and shunted to ground. A signal ground point G is coupled to the ground of the divider network.

In the active test probe shown in FIG. 4, the first resistor-capacitor pair ($R_{32}$ and $C_{34}$) and the second resistor-capacitor pair ($R_{36}$ and $C_{38}$) form a divider that attenuates the signal and compensates for parasitic effects that the amplifier would otherwise place on the circuit. The amplifier 30 must have high input impedance so that the active test probe does not load the circuit. The impedance of the amplifier 30 is frequency dependent, however, and a limitation of the active test probe is that an amplifier 30 with the required high input impedance at very high frequencies is not readily available. Another limitation of the active test probe is that as frequency increases, the input structure (i.e., the resistive/capacitive divider network and other components, such as the probe tip) becomes large with respect to the electrical wavelength. In situations where the frequency is high enough so that the input structure is large with respect to the wavelength, signals will be distorted as the result of electromagnetic wave reflection. The input structure, therefore, must be kept small with respect to the electrical wavelength and the amplifier 30 must be situated as close as possible to the signal test point S.

Figure 5:
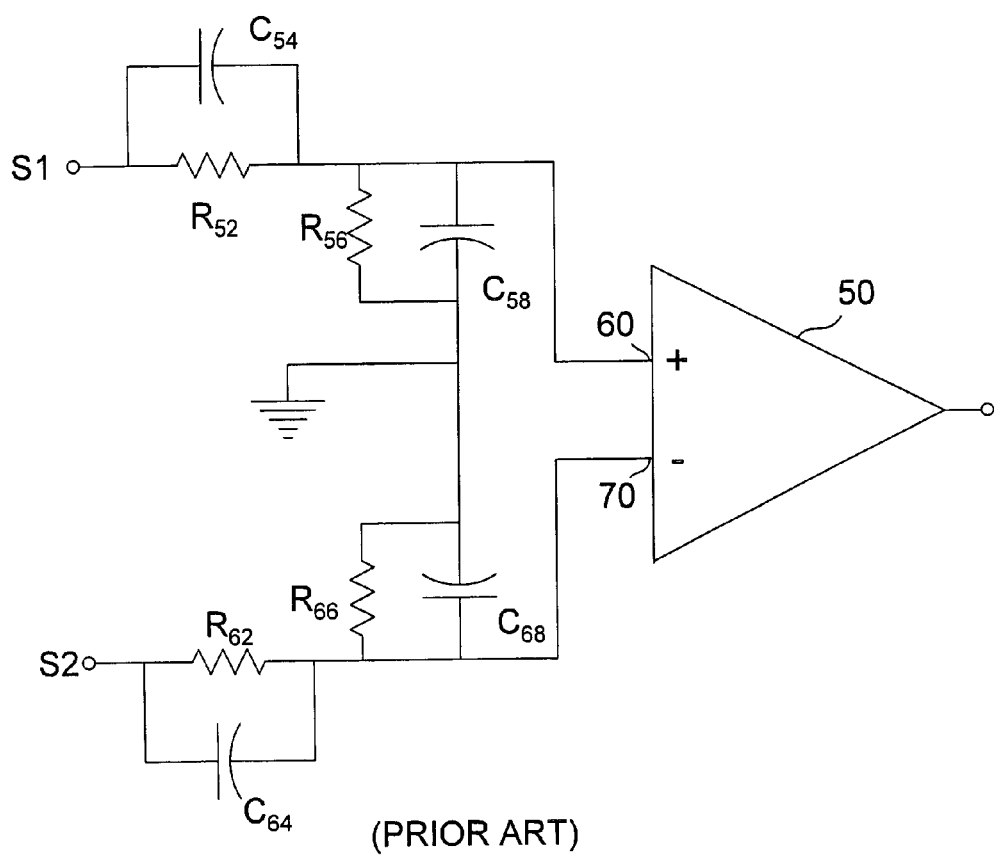
FIG. 5 is a circuit diagram of an exemplary prior art active differential test probe.

As previously indicated, the active test probe design may be used in differential test probes. FIG. 5 illustrates an exemplary prior art active differential test probe having two resistive/capacitive divider networks, one for each signal to be measured, and a differential amplifier 50. The first divider network includes a first resistor $R_{52}$ and a first capacitor $C_{54}$ coupled, in parallel, between a first signal test point S1 and a first input 60 of the differential amplifier 50. The first divider network also includes a second resistor $R_{56}$ and a second capacitor $C_{58}$ coupled, in parallel, to the first input 60 of the differential amplifier 50 and shunted to ground. Similarly, the second divider network includes a first resistor $R_{62}$ and a first capacitor $C_{64}$ coupled, in parallel, between a second signal test point S2 and a second input 70 of the differential amplifier 50. The second divider network also includes a second resistor $R_{66}$ and a second capacitor $C_{68}$ coupled, in parallel, to the second input 70 of the differential amplifier 50 and shunted to ground.

To obtain an accurate measurement of the difference between the two measured signals S1 and S2 with the active differential test probe shown in FIG. 5, the components in the two divider networks must be accurately matched. In other words, each divider network must provide the same amount of attenuation and compensation. In practice, however, it can be difficult to properly match the components of the two divider networks. Further, as mentioned, a limitation of active test probes is that the input structure must be small relative to the wavelength and the amplifier must be situated as close as possible to the signal test point. This limitation is especially problematic in situations such as that shown in which the two test points S1 and S2 may not be physically adjacent in the circuit under test. In other words, it may not be physically possible to keep both the input structure small and the amplifier 50 close to spaced-apart test points S1 and S2.

Having described the prior art test probes shown in FIGS. 2–5, an active differential test probe with a transmission line input structure 100 according to the present invention will be shown in FIGS. 6–8 and described below.

Figure 6:
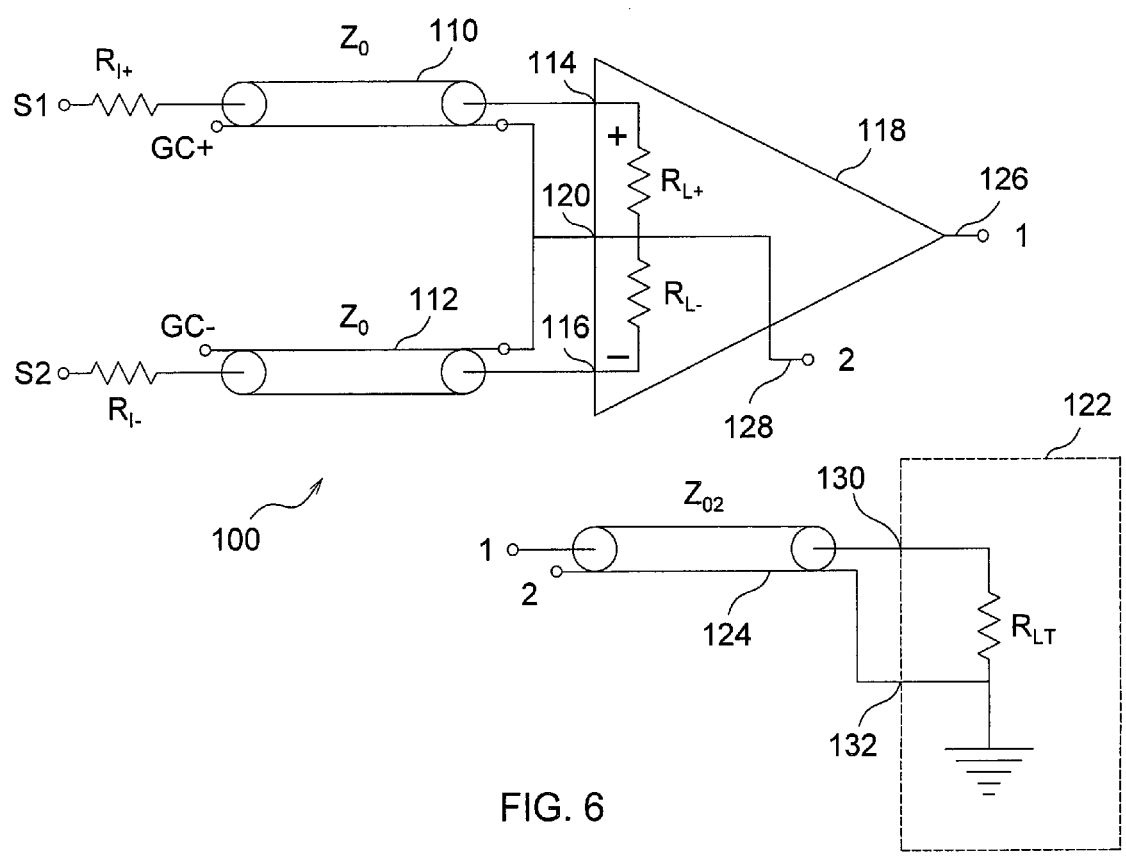
FIG. 6 is a circuit diagram of an active differential test probe with an exemplary transmission line input structure according to the present invention coupled to an exemplary test instrument.

Turning to FIG. 6, the test probe 100 includes first and second resistors $R_{I+}$, $R_{I-}$ first and second transmission line structures 110, 112, and a differential amplifier 118. Each of the transmission line structures 110, 112 has a signal conductor and a ground conductor. The differential amplifier 118 has a first signal input 114, a second signal input 116, a ground input 120, and a differential output 126.

As shown in FIG. 6, the first resistor $R_{I+}$ is coupled between a first signal test point S1 and the signal conductor of the first transmission line structure 110. At the end GC+, where the signal conductor of the first transmission line structure 110 is coupled with the first resistor $R_{I+}$, the ground return conductor of the first transmission line 110 is left uncoupled ("floating"). At an end opposite first resistor $R_{I+}$, the signal conductor of the first transmission line structure 110 is coupled to the first signal input 114 of the differential amplifier 118 and the ground return conductor of the first transmission line 110 is coupled to the ground input 120.

Similarly, the second resistor $R_{I-}$ is coupled between a second signal test point S2 and the signal conductor of the second transmission line structure 112. At the end GC-, where the signal conductor of the second transmission line structure 112 is coupled with the second resistor $R_{I-}$, the ground return conductor of the second transmission line 112 is left floating. At an end opposite second resistor $R_{I-}$, the signal conductor of the second transmission line structure 112 is coupled to the second signal input 116 of the differential amplifier 118 and the ground return conductor of the second transmission line 112 is coupled to the ground input 120.

The first and second signal inputs 114, 116 of the differential amplifier 118 each have an input resistance that may be modeled and represented symbolically, as shown in FIG. 6 and referred to hereinafter, by termination resistors $R_{L+}$, $R_{L-}$. It will be appreciated by one skilled in the art that the differential amplifier 118 preferably does not, in fact, include termination resistors $R_{L+}$, $R_{L-}$. Rather, the differential amplifier 118 includes an input circuit including resistors, capacitors, and transistors that, in combination, have input impedances with respect to ground that are equivalent to the shown termination resistors $R_{L+}$, $R_{L-}$. As shown in FIG. 6, termination resistor $R_{L+}$ is coupled in series between the first signal input 114 and the ground input 120. Similarly, termination resistor $R_{L-}$ is coupled in series between the second signal input 116 and the ground input 120.

The resistive values of termination resistors $R_{L+}$, $R_{L-}$ are such that they match the characteristic impedances $Z_O$ of the first and second transmission line structures 110, 112. In addition, the first and second transmission line structures 110, 112 have characteristic impedances $Z_O$ and electrical lengths that are substantially identical. In one preferred embodiment, the first and second transmission line structures 110, 112 are strip line structures. In an alternative preferred embodiment, the first and second transmission line structures 110, 112 are coaxial cables.

One advantage of the present invention, therefore, may be that it is relatively easy to accomplish the design of differential amplifier 118 with input resistances $R_{L+}$, $R_{L-}$ having values that match the characteristic impedances $Z_O$ of the first and second transmission line structures 110, 112.

FIG. 6 also shows a test instrument 122 and a coaxial cable transmission line 124 coupling the test probe 100 to the test instrument 122 at points 1, 2. The cable 124 has a signal conductor, a ground conductor, and a characteristic impedance $Z_{O2}$. At a first end of cable 124, the signal conductor is coupled to a differential output 126 of the differential amplifier 118 and the ground conductor is coupled to a ground output 128. At its opposite end, the signal conductor of the cable 124 is coupled to a signal input 130 of the test instrument 122 and the ground conductor of the cable 124 is coupled to a ground input 132 of the test instrument 122. The test instrument 122 includes a termination resistor RLT that is coupled in series between the signal input 130 and the ground input 132. The resistive value of the termination resistor $R_{LT}$ is equal to the characteristic impedance $Z_{O2}$ of the cable 124.

Figure 7:
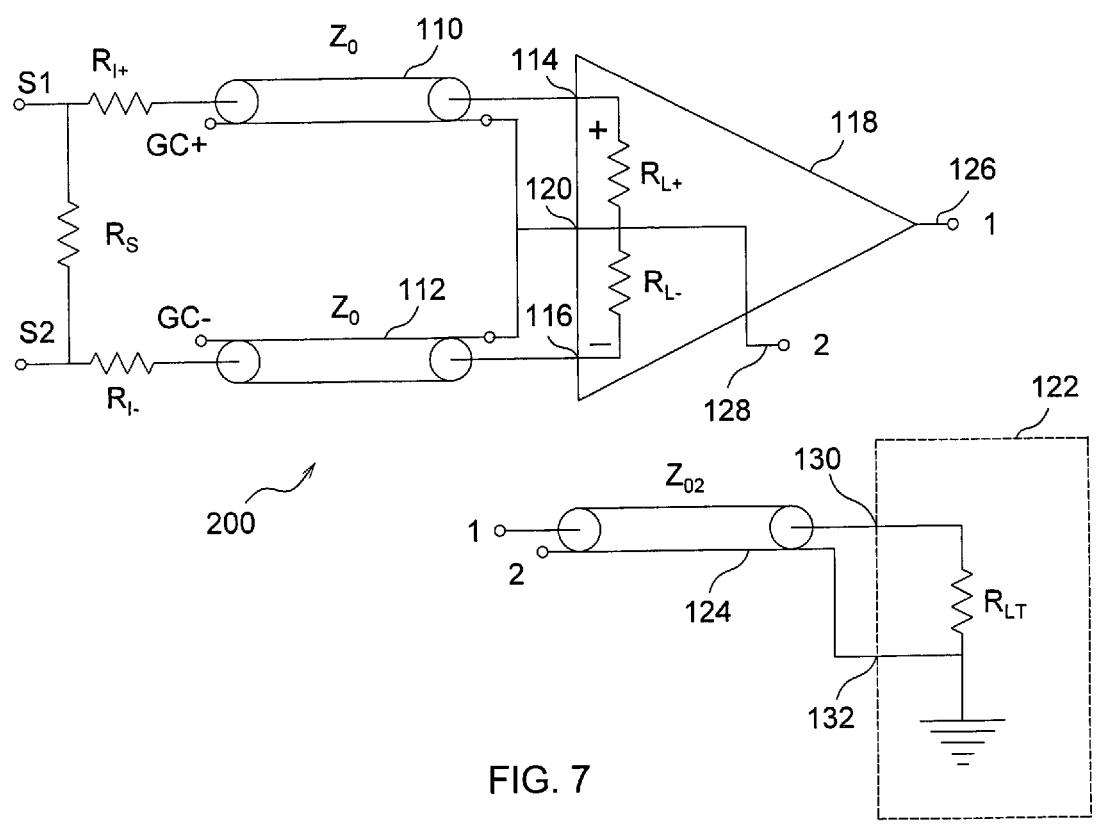
FIG. 7 is a circuit diagram of an active differential test probe of the present invention that may be used to measure current.

FIG. 7 shows an alternative embodiment of the present invention that may be used to measure current. The test probe 200 shown in this figure is similar to the test probe 100 shown in FIG. 6 and like elements are denoted by like reference numbers. The test probe 200 further includes a shunt resistor $R_S$ that is coupled between the first resistor $R_{L+}$ at and end near the first signal test point S1 and the second resistor $R_{L-}$ at an end near the second signal test point S2. The shunt resistor $R_S$ preferably has a small resistive value. The voltage at the differential output 126 is proportional to the current in the shunt resistor $R_S$.

Figure 8:
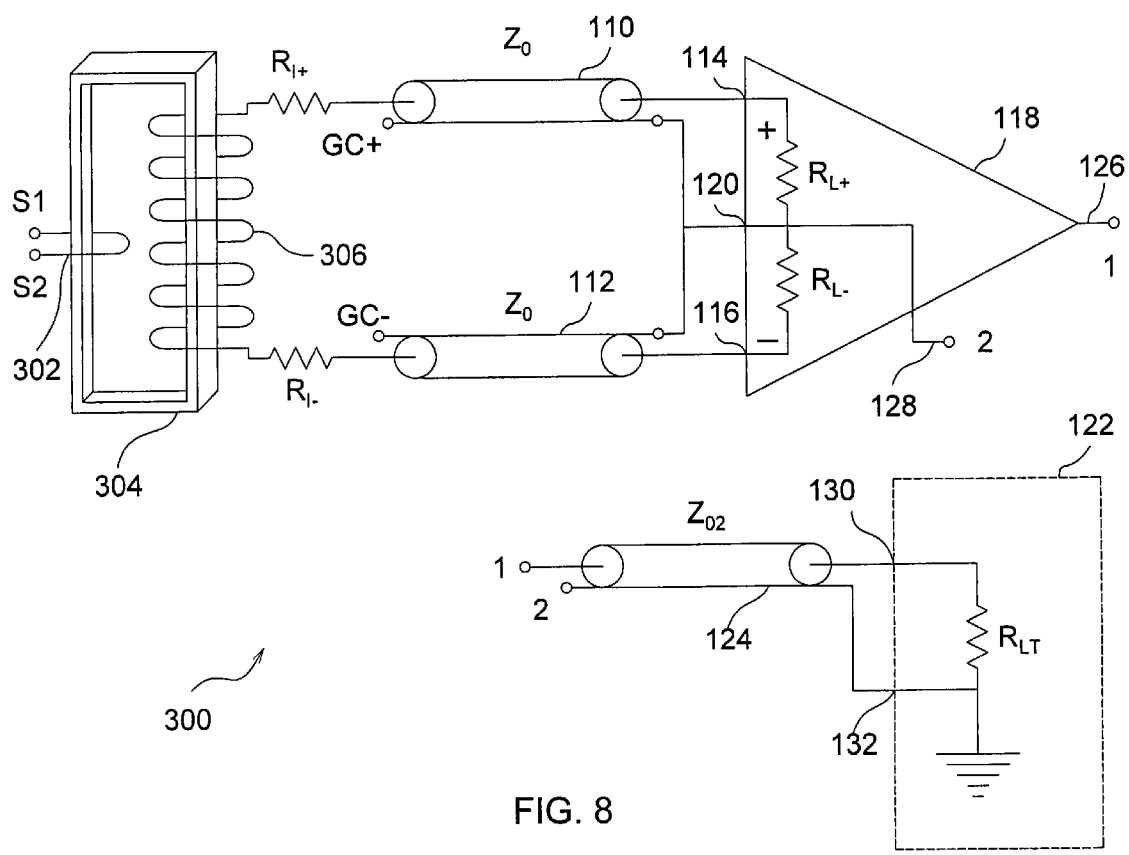
FIG. 8 is a circuit diagram of an active differential test probe of the present invention that may be used to measure AC current flowing in a first conductor.

FIG. 8 illustrates yet another embodiment of a test probe according to the present invention that may be used to measure AC current flowing in a first conductor 302. The test probe 300 shown in this figure is similar to the test probe 100 shown in FIG. 6 and like elements are denoted with like reference numbers. The test probe 300 further includes a magnetic core 304 and a second conductor 306. The current to be measured flows between test points S1 and S2 in first conductor 302. As shown in FIG. 8, the first conductor 302 passes though the magnetic core 304. The second conductor 306 is wound at least one time around at least one section of the magnetic core 304. In addition, the second conductor 306 is coupled between the first resistor $R_{L+}$ at an end of opposite the first transmission line structure 110 and the second resistor $R_{L-}$ at an end opposite the second transmission line structure 112. It will be appreciated that DC capability could be added to the test probe shown in FIG. 8 by employing known "bucking" techniques.

Figure 9:
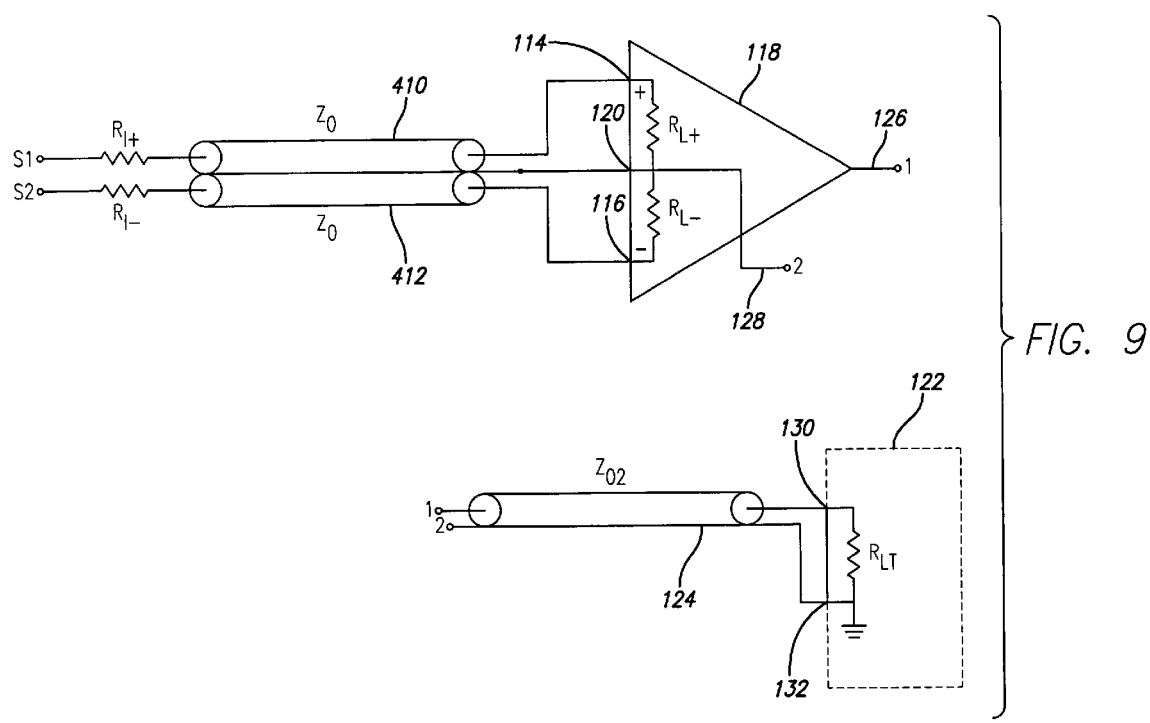
FIG. 9 is a circuit diagram of an active differential test probe with an exemplary transmission line input structure with a common reference according to the present invention coupled to an exemplary test instrument.

FIG. 9 is similar to the embodiment of FIG. 6, except that the first and second transmission line structures 410, 412 share a common reference 414. Although shown as sharing the common reference along the entire length, it should be noted that the first and second transmission line structures 410, 412 can share a common reference 414 along only a part of the length.

In yet another additional alternate embodiment, the current may be measured using the test probe shown in FIG. 6 where the impedance between test points S1 and S2 in the circuit under test is known.

FIGS. 10–18 show an embodiment in which the transmission line structures of a differential probe are printed on a common substrate. For exemplary purposes, this embodiment implements the circuitry detailed in FIG. 9 in which the first and second transmission line structures 410, 412 share the common reference along at least part of the length. The basic function of the probe is to amplify the difference in voltage between the two points of contact (input signals), and to reject any signals that are common to the two points of contact. For this to occur, the transmission line structures must have very well matched electrical lengths. This means that a common signal propagating along both transmission line structures will arrive at the amplifier inputs at exactly the same time. The input signals will then be rejected by the amplifier since the two input signals are equal. If, however, the two electrical lengths are not equal, then the common signal will arrive at one amplifier input before it arrives at other amplifier input. This will cause the input signals to appear as a differential signal at the amplifier inputs that the amplifier will not be able to reject.

The electrical length of the transmission line structures is determined by the physical length of the conductors and by the dielectric constant of the materials between the conductors. Because the print process is very precise, printing both transmission line structures on the same substrate insures that the two conductors are physically identical in length. Further, because the transmission line structures share the same dielectric material on which they are printed, an excellent match of electrical length is insured. Since the transmission line structures are held in close proximity to each other, local variation in the dielectric constant and/or thickness of the substrate material will apply equally to both transmission line structures, insuring that the impedance and the electrical length matches.

FIGS. 10–18 show a the test probe tip 400 that includes first and second resistors $R_{L+}$, $R_{L-}$, first and second transmission line structures 410, 412 (which may be traces), and a differential amplifier. In one preferred embodiment, the differential amplifier is positioned in the probe body (module 432) so that the tip may be replaced without having to replace the differential amplifier. In an alternative embodiment, the differential amplifier could be positioned inside the plastic housing 420 of the removable tip 400. Each of the transmission line structures 410, 412 has a signal conductor and a ground conductor. The transmission line structures 410, 412 in this embodiment are matched transmission lines printed on circuit board material 430. In one preferred embodiment, the transmission line structures 410, 412 (e.g. the dual transmission line embodiments set forth above) could be implemented on a single flexible substrate 430. The flexible substrate 430 may be, any type of flexible electronic device made from flexible plastic, metal foil, or other non-rigid material. Exemplary flexible substrates include PYRALUX® (made by Dupont) and R/FLEX 1000® (made by Rogers Corporation). The shown embodiment also may include a common reference 414 (shown in FIGS. 13–17 as a metal ground plane on the backside of the substrate 430).

The entire tip system would then be flexible as the films deposited on the substrate 430 are usually very thin, on the order of a few micrometers.

Figure 13:
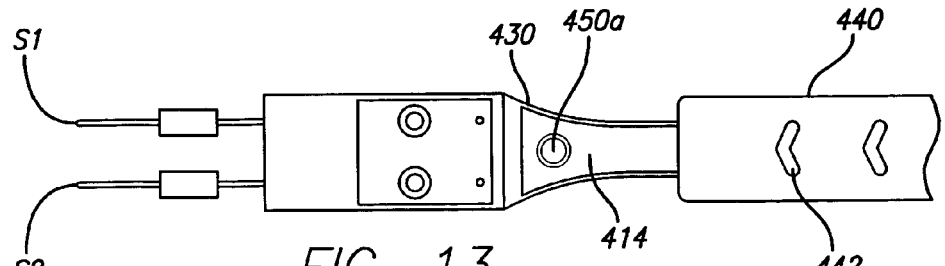
FIG. 13 is an enlarged bottom view of the front-most portion of the probe tip of FIG. 10.
Figure 14:
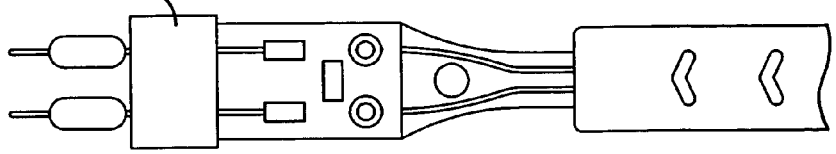
FIG. 14 is an enlarged top view of the front-most portion of a second exemplary probe tip.
Figure 15:
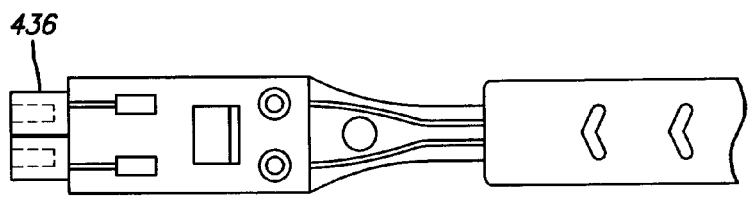
FIG. 15 is an enlarged top view of the front-most portion of a third exemplary probe tip.

FIGS. 12–14 show three different chip connection portions. FIG. 12 is a solder-in interconnect lead that features the smallest physical tip size of any high bandwidth differential probe and the highest level of electrical performance. Two very small dampening resistors are directly soldered to the connect points providing a reliable, intermittent free electrical connection. The resistors have highly flexible leads allowing connection to input points with a wide range of input spacing. FIG. 13 is a quick connect interconnect lead that enables a user to quickly move the probe between multiple test points on the test circuit. A user would solder a pair of damping resistors at each location where interconnection is required. A small connector 434 mounted on the probe tip plugs into the damping resistors, letting the user quickly move between sets of test points. FIG. 14 includes a square pin interconnect lead for use with standard square pins (e.g. 0.025" square pins on IC characterization boards). The square pin interconnect lead 436 directly mates with a pair of standard square pins which are mounted on standard centers. It should be noted, however that alternative square pin interconnect leads could be used with non-standard square pins.

One of the advantages of this embodiment is that it insures that the electrical lengths of the dual transmission lines (e.g. transmission line structures 410, 412) will be identical—a solution that allows the transmission line structures 410, 412 of this embodiment to be elongated as compared to other embodiments. (It should be noted that the longer the transmission lines, the more important the matching becomes. The important parameter to insure a good match is the difference in propagation delay parameter. If transmission lines have slightly difference dielectric constants, then the propagation velocities will be different. For a given difference in velocity, longer lines will result in a larger difference in propagation delay.) For example, as compared to an embodiment in which coaxial cable (e.g. miniature coax) is used, it is much easier to ensure that the electrical lengths of the transmission lines are identical. Another advantage of this embodiment is the small size (e.g. 0.150 inches wide and 0.03 inches high) of the probe tip as compared to traditional probe tips (e.g. 0.5 inches wide and 0.5 inches high) and competitor's state of the art products (e.g. 0.150 inches wide and 0.06 inches high). This is possible because the use of the dual transmission lines on a flexible substrate allows the amplifier (and/or the probe body (module 432)), the largest part of a traditional probe tip, to be remote from the remainder of the probe tip. Yet another advantage of this embodiment is that it is mechanically very stable in that it can be folded, bent, and/or pinched with only a minimal risk of damage or change in electrical characteristics.

Figure 16:
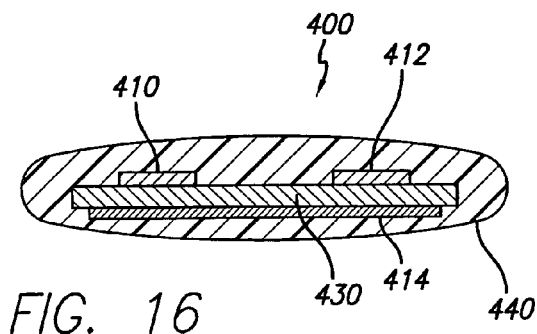
FIG. 16 is a cross-sectional view of the matched transmission lines on a common substrate that may be flexible enclosed in an over-mold taken along line 16'—16'of FIG. 10.
Figure 17:
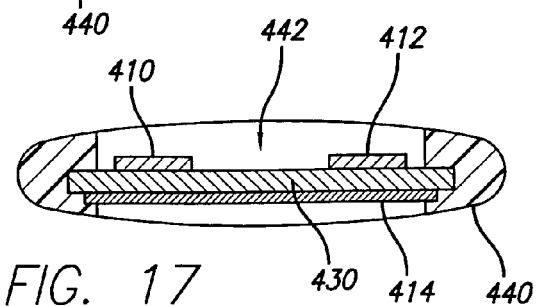
FIG. 17 is a cross-sectional view of the matched transmission lines on a common substrate that may be flexible enclosed in an over-mold taken along line 17'—17'of FIG. 10.

FIGS. 10, 16, and 17 show that the transmission line structures 410, 412 may be at least partially enclosed in an over-mold 440. The use of an over-mold 440 protects the transmission line structures 410, 412 from electromagnetic Interference (EMI) by providing both physical protection and spacing from EMI sources to prevent stray signals from interfering. In the shown embodiment where the substrate 430 is 0.007" thick and the transmission line structures 410, 412 are 0.007" thick, the over-mold 440 could be approximately 0.005"–0.04" thick. It should be noted that the thickness of the over-mold 440 could be adjusted depending on factors such as the thickness or thinness of the substrate 430 and/or the transmission line structures 410, 412 or if signals to be measured are stronger or weaker than those typically found in traditional circuit boards. It should also be noted that these dimensions are meant to be exemplary and are not meant to limit the scope of the invention.

In addition to protecting the transmission line structures 410, 412 from EMI, the over-mold 440 provides several advantageous features including, but not limited to preventing a users fingers from getting too close to the dual transmission lines and preventing circuitry or other mechanical parts from getting too close to the dual transmission lines. For example, if a user were to pinch the transmission line structures 410, 412 that were not enclosed in the over-mold 440, the transmission line characteristics would change, resulting in a change in the performance of the probe. With the over-mold 440, however, the user's fingers are held far enough away from the transmission line structures 410, 412 that any change in performance is prevented. When the over-mold 440 is used in an embodiment where the substrate 430 and the transmission line structures 410, 412 are flexible, it helps with (or at least does not interfere with) the mechanical stability in that the embodiment can be folded, bent, and/or pinched with only a minimal risk of damage or change in electrical characteristics.

In the shown embodiment of FIG. 10, the over-mold 440 is a "braided" over-mold. In the shown embodiment, the over-mold 440 has a plurality of gaps 442 or spaces defined therein. FIG. 16 shows a cross section of the transmission line structures 410, 412, the substrate 430, and the over-mold 440 taken along line 16'—16' where there is no gap 442. FIG. 17 shows a cross section of the transmission line structures 410, 412, the substrate 430, and the over-mold 440 taken along line 17'—17' where there is a gap 442. These gaps allow for additional flexibility. These gaps 442 also help to create a patterned non-slip grip.

Although the term "over-mold" is used, the over-mold 440 may be created using a "shrink sleeve" process or an over-molding process. If an over-molding process is used with a flexible embodiment of the present invention, one or more retention mechanisms may be used to facilitate the over-molding process. For exemplary purposes, FIG. 11 shows over-molding retention mechanisms 450a, 450b, 450c that would work with complementary over-molding retention mechanisms in the mold cavity. For exemplary purposes, the over-molding retention mechanisms 450a, 450b are shown as holes that fit over hold down dowels in the mold cavity. Optional retention mechanism 450c may be filled with plastic during the over-molding process to help hold the plastic in place once it is molded over the flex. In addition, an elaborate gating system could be used to flow the plastic thinly around the transmission line structures 410, 412 and the substrate 430. This elaborate gating system could also be used to create the braided effect and gaps 442 in the over-mold.

Figure 18:
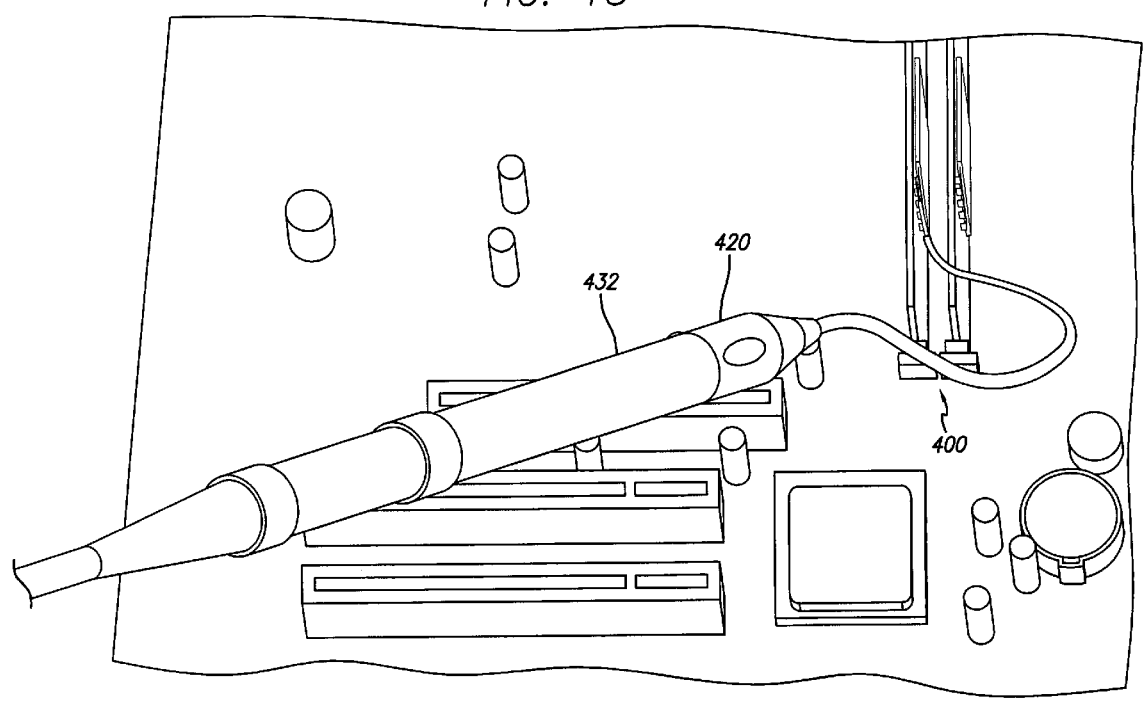
FIG. 18 is an enlarged top view of the front-most portion of the probe tip of FIG. 10 probing an IC.

FIG. 18 shows a flexible embodiment in which the transmission lines of a differential probe are printed on a common flexible substrate. As can be seen, the transmission line structures 410, 412 are elongated and the probe tip is very small (at least partially because the amplifier is remote from the remainder of the probe tip). The width between the signal test points S1, S2 may be adjusted by bending or shaping the wires at the front of the probe tip. This configuration allows the test probe to reach hard to reach spaced-apart test points.

The test probes of the present invention solve the problems inherent in the prior art test probes. Because the input structure is a terminated transmission line, the input structure does not need to be small with respect to the electrical wavelength and the amplifier does not need to be as close as possible to the input structure. The first and second transmission line structures 110, 112 can be any reasonable length and the amplifier may be situated remotely from the signal test points S1, S2. (The input structure has a reasonable length so long as the input structure approximates a lossless transmission line.) This results in considerable ease and flexibility when simultaneously sampling a plurality of signals. Further, the test probes of the present invention do not require two resistor/capacitor divider networks, nor do they require matching the components of the two divider networks. The present invention only requires that: (1) the input structures have characteristic impedances and electrical length that are substantially the same, and (2) the resistors between the test points and the transmission line structures have resistive values that are substantially the same. Practically, this is much easier to achieve than matching the components in the resistor/capacitor divider networks. Moreover, the test probe 100 does not require a differential amplifier with a high input impedance value thereby simplifying amplifier design and permitting the use of the test probe of the present invention at higher frequencies than are possible with an active test probe.

While the transmission lines of the test probes of the present invention have been described in terms of a strip line, it will be appreciated that any form of transmission line may be used, such as coaxial cable, parallel plates, or parallel wires. In addition, while the present invention has been described in terms of differential test probe with two signal inputs, it will be appreciated that the present invention may be practiced with a single signal input or with three or more signal inputs. Moreover, while the test probes of the present invention have been described as having first and second resistors $R_{I+}$, $R_{I-}$, it will be appreciated that the resistors may have any suitable resistive value.

Although the present invention may be implemented with prior art dual tip systems, the present invention may be implemented with a unique dual tip system that includes a control mechanism (e.g. a ratchet slider or a friction system) for controlled placement of the dual probe tips. It should be noted that any control mechanism that allows controlled movement between the dual probe tips could function as a control mechanism. Still further, it should be noted that the dual tip system may be implemented as a plug in unit or as a unit integrated into a probing head. The dual tip system may include one movable probe tip and one fixed probe tip. Alternatively, the dual tip system may include two movable probe tips. Any of the embodiments of the dual tip system may be implemented using a movable/fixed or dual movable movement system. The probe tips of the dual tip system may be connected together at the back ends or they may be separately controlled. In alternative embodiments the probe tips cross at the back and are controlled through the intersection thereof. The probe tips may swivel about respective points or may slide in relation to each other. The probe tips may be held in position relative to each other by a control mechanism (e.g. a ratchet slider or a friction system). Alternative embodiments may include a locking structure to hold the dual probe tips in place. These configurations of the dual tip system are meant to be exemplary and are not meant to limit the scope of the invention.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. An electrical test probe for sensing a plurality of electric signals and generating a differential signal, said electrical test probe comprising:
   (a) a common substrate;
   (b) a first transmission line on said common substrate, said first transmission line comprising a first signal conductor and a first ground conductor, said first transmission line having a characteristic impedance substantially equal to a first predetermined value;
   (c) a second transmission line on said common substrate, said second transmission line comprising a second signal conductor and a second ground conductor, said second transmission line having a characteristic impedance substantially equal to a second predetermined value; and
   (d) a differential amplifier having a first signal input, a second signal input, and a ground input;
      (i) wherein a first input resistor is coupled between said first signal input and said ground input, said first input resistor having a resistive value substantially equal to said first predetermined value;
      (ii) wherein a second input resistor is coupled between said second signal input and said ground input, said second input resistor having a resistive value substantially equal to said second predetermined value;
      (iii) wherein a first end of said first signal conductor is coupled to said first signal input and a first end of said first ground conductor is coupled to said ground input;
      (iv) wherein a first end of said second signal conductor is coupled to said second signal input and a first end of said second ground conductor is coupled to said ground input;
      (v) wherein a second end of said first signal conductor is coupled to a first test point and a second end of said first ground conductor is floating; and
      (vi) wherein a second end of said second signal conductor is coupled to a second test point and a second end of said second ground conductor is floating.

2. The electrical test probe of claim 1 wherein said common substrate is a flexible substrate.

3. The electrical test probe of claim 1 further comprising an over-mold at least partially enclosing said common substrate, said first transmission line, and said second transmission line.

4. A transmission line input structure for use with an electrical test probe, said electrical test probe for sensing a plurality of electric signals and generating a differential signal, said transmission line input structure comprising:
   (a) a common substrate;
   (b) a first transmission line on said common substrate, said first transmission line comprising a first signal conductor and a first ground conductor, said first transmission line having a characteristic impedance substantially equal to a first predetermined value;
   (c) a second transmission line on said common substrate, said second transmission line comprising a second signal conductor and a second ground conductor, said second transmission line having a characteristic impedance substantially equal to a second predetermined value; and
   (d) a differential amplifier having a first signal input, a second signal input, and a ground input;
      (i) wherein a first input resistor is coupled between said first signal input and said ground input, said first input resistor having a resistive value substantially equal to said first predetermined value;

(ii) wherein a second input resistor is coupled between said second signal input and said ground input, said second input resistor having a resistive value substantially equal to said second predetermined value;

(iii) wherein a first end of said first signal conductor is coupled to said first signal input and a first end of said first ground conductor is coupled to said ground input;

(iv) wherein a first end of said second signal conductor is coupled to said second signal input and a first end of said second ground conductor is coupled to said ground input;

(v) wherein a second end of said first signal conductor is coupled to a first test point and a second end of said first ground conductor is floating; and (vi) wherein a second end of said second signal conductor is coupled to a second test point and a second end of said second ground conductor is floating.

5. The transmission line input structure of claim 4 wherein said common substrate is a flexible substrate.

6. The transmission line input structure of claim 4 further comprising an over-mold at least partially enclosing said common substrate, said first transmission line, and said second transmission line.

7. A method for sampling a plurality of electrical signals in a circuit and generating a differential signal, said method comprising the steps of:

(a) providing a first transmission line on a common substrate, said first transmission line comprising a first signal conductor and a first ground conductor, said first transmission line having a characteristic impedance substantially equal to a first predetermined value;

(b) providing a second transmission line on said common substrate, said second transmission line comprising a second signal conductor and a second ground conductor, said second transmission line having characteristic impedance substantially equal to a second predetermined value;

(c) providing a differential amplifier having a first input, a second input, and a ground input;

(i) wherein said first input comprises a first input resistor coupled between said first signal input and said ground input, said first input resistor having a resistive value substantially equal to said first predetermined value;

(ii) wherein said second input comprises a second input resistor coupled between said second signal input and said ground input, said second input resistor having a resistive value substantially equal to said second predetermined value;

(iii) wherein a first end of said first signal conductor is coupled to said first signal input and a first end of said first ground conductor is coupled to said ground input;

(iv) wherein a first end of said second signal conductor is coupled to said second signal input and a first end of said second ground conductor is coupled to said ground input;

(d) coupling a second end of said first signal conductor to a first test point and allowing a second end of said first ground conductor to float; and (e) coupling a second end of said second signal conductor to a second test point and allowing a second end of said second ground conductor to float.

8. The method of claim 7, said steps of providing a first transmission line and providing a second transmission line further comprising the steps of providing said first transmission line on a flexible substrate and providing said second transmission line said flexible substrate.

9. The method of claim 7 further comprising the step of at least partially enclosing said common substrate, said first transmission line, and said second transmission line in an over-mold.

10. An electrical test probe for sensing a plurality of electric signals and generating a differential signal, said electrical test probe comprising:

(a) a common substrate;

(b) a first transmission line on said common substrate, said first transmission line comprising a first signal conductor and a first ground conductor, said first transmission line having a characteristic impedance substantially equal to a first predetermined value;

(c) a second transmission line on said common substrate, said second transmission line comprising a second signal conductor and a second ground conductor, said second transmission line having a characteristic impedance substantially equal to a second predetermined value; and (d) a differential amplifier having a first signal input, a second signal input, and a ground input;

(i) wherein a first input resistor is coupled between said first signal input and said ground input, said first input resistor having a resistive value substantially equal to said first predetermined value;

(ii) wherein a second input resistor is coupled between said second signal input and said ground input, said second input resistor having a resistive value substantially equal to said second predetermined value;

(iii) wherein a first end of said first signal conductor is coupled to said first signal input and a first end of said first ground conductor is coupled to said ground input;

(iv) wherein a first end of said second signal conductor is coupled to said second signal input and a first end of said second ground conductor is coupled to said ground input;

(v) wherein a second end of said first signal conductor is coupled to a first test point; and (vi) wherein a second end of said second signal conductor is coupled to a second test point.

11. The electrical test probe of claim 10 wherein said common substrate is a flexible substrate.

12. The electrical test probe of claim 10 further comprising an over-mold at least partially enclosing said common substrate, said first transmission line, and said second transmission line.

13. A transmission line input structure for use with an electrical test probe, said electrical test probe for sensing a plurality of electric signals and generating a differential signal, said transmission line input structure comprising:

(a) a common substrate;

(b) a first transmission line on said common substrate, said first transmission line comprising a first signal conductor and a first ground conductor, said first transmission line having a characteristic impedance substantially equal to a first predetermined value;

(c) a second transmission line on said common substrate, said second transmission line comprising a second signal conductor and a second ground conductor, said second transmission line having a characteristic impedance substantially equal to a second predetermined value; and
(d) a differential amplifier having a first signal input, a second signal input, and a ground input;
   (i) wherein a first input resistor is coupled between said first signal input and said ground input, said first input resistor having a resistive value substantially equal to said first predetermined value;
   (ii) wherein a second input resistor is coupled between said second signal input and said ground input, said second input resistor having a resistive value substantially equal to said second predetermined value;
   (iii) wherein a first end of said first signal conductor is coupled to said first signal input and a first end of said first ground conductor is coupled to said ground input;
   (iv) wherein a first end of said second signal conductor is coupled to said second signal input and a first end of said second ground conductor is coupled to said ground input;
   (v) wherein a second end of said first signal conductor is coupled to a first test point; and
   (vi) wherein a second end of said second signal conductor is coupled to a second test point.

14. The transmission line input structure of claim 13 wherein said common substrate is a flexible substrate.

15. The transmission line input structure of claim 13 further comprising an over-mold at least partially enclosing said common substrate, said first transmission line, and said second transmission line.

16. A method for sampling a plurality of electrical signals in a circuit and generating a differential signal, said method comprising the steps of:
(a) providing a first transmission line on a common substrate, said first transmission line comprising a first signal conductor and a first ground conductor, said first transmission line having a characteristic impedance substantially equal to a first predetermined value;
(b) providing a second transmission line on said common substrate, said second transmission line comprising a second signal conductor and a second ground conductor, said second transmission line having characteristic impedance substantially equal to a second predetermined value;
(c) providing a differential amplifier having a first input, a second input, and a ground input;
   (i) wherein said first input comprises a first input resistor coupled between said first signal input and said ground input, said first input resistor having a resistive value substantially equal to said first predetermined value;
   (ii) wherein said second input comprises a second input resistor coupled between said second signal input and said ground input, said second input resistor having a resistive value substantially equal to said second predetermined value;
   (iii) wherein a first end of said first signal conductor is coupled to said first signal input and a first end of said first ground conductor is coupled to said ground input;
   (iv) wherein a first end of said second signal conductor is coupled to said second signal input and a first end of said second ground conductor is coupled to said ground input;
(d) coupling a second end of said first signal conductor to a first test point; and
(e) coupling a second end of said second signal conductor to a second test point.

17. The method of claim 16, said steps of providing a first transmission line and providing a second transmission line further comprising the steps of providing said first transmission line on a flexible substrate and providing said second transmission line said flexible substrate.

18. The method of claim 16 further comprising the step of at least partially enclosing said common substrate, said first transmission line, and said second transmission line in an over-mold.

19. An electrical test probe for sensing a plurality of electric signals and generating a differential signal, said electrical test probe comprising:
(a) a common substrate;
(b) a first transmission line on said common substrate, said first transmission line comprising a first signal conductor and a first ground conductor, said first transmission line having a characteristic impedance substantially equal to a first predetermined value;
(c) a second transmission line on said common substrate, said second transmission line comprising a second signal conductor and a second ground conductor, said second transmission line having a characteristic impedance substantially equal to a second predetermined value; and
(d) a differential amplifier having a first signal input, a second signal input, and a ground input;
   (i) wherein a first input resistor is coupled between said first signal input and said ground input, said first input resistor having a resistive value substantially equal to said first predetermined value;
   (ii) wherein a second input resistor is coupled between said second signal input and said ground input, said second input resistor having a resistive value substantially equal to said second predetermined value;
   (iii) wherein a first end of said first signal conductor is coupled to said first signal input and a first end of said first ground conductor is coupled to said ground input;
   (iv) wherein a first end of said second signal conductor is coupled to said second signal input and a first end of said second ground conductor is coupled to said ground input;
   (v) wherein a second end of said first signal conductor is coupled to a first test point and a second end of said first ground conductor is unreferenced with respect to ground; and
   (vi) wherein a second end of said second signal conductor is coupled to a second test point and a second end of said second ground conductor is unreferenced with respect to ground.

20. The electrical test probe of claim 19 wherein said common substrate is a flexible substrate.

21. The electrical test probe of claim 19 further comprising an over-mold at least partially enclosing said common substrate, said first transmission line, and said second transmission line.

22. A transmission line input structure for use with an electrical test probe, said electrical test probe for sensing a plurality of electric signals and generating a differential signal, said transmission line input structure comprising:
(a) a common substrate;
(b) a first transmission line on said common substrate, said first transmission line comprising a first signal conductor and a first ground conductor, said first transmission line having a characteristic impedance substantially equal to a first predetermined value;

(c) a second transmission line on said common substrate, said second transmission line comprising a second signal conductor and a second ground conductor, said second transmission line having a characteristic impedance substantially equal to a second predetermined value; and (d) a differential amplifier having a first signal input, a second signal input, and a ground input;
  (i) wherein a first input resistor is coupled between said first signal input and said ground input, said first input resistor having a resistive value substantially equal to said first predetermined value;
  (ii) wherein a second input resistor is coupled between said second signal input and said ground input, said second input resistor having a resistive value substantially equal to said second predetermined value;
  (iii) wherein a first end of said first signal conductor is coupled to said first signal input and a first end of said first ground conductor is coupled to said ground input;
  (iv) wherein a first end of said second signal conductor is coupled to said second signal input and a first end of said second ground conductor is coupled to said ground input;
  (v) wherein a second end of said first signal conductor is coupled to a first test point and a second end of said first ground conductor is unreferenced with respect to ground; and
  (vi) wherein a second end of said second signal conductor is coupled to a second test point and a second end of said second ground conductor is unreferenced with respect to ground.

23. The transmission line input structure of claim 22 wherein said common substrate is a flexible substrate.

24. The transmission line input structure of claim 22 further comprising an over-mold at least partially enclosing said common substrate, said first transmission line, and said second transmission line.

25. A method for sampling a plurality of electrical signals in a circuit and generating a differential signal, said method comprising the steps of:
  (a) providing a first transmission line on a common substrate, said first transmission line comprising a first signal conductor and a first ground conductor, said first transmission line having a characteristic impedance substantially equal to a first predetermined value;
  (b) providing a second transmission line on said common substrate, said second transmission line comprising a second signal conductor and a second ground conductor, said second transmission line having characteristic impedance substantially equal to a second predetermined value;
  (c) providing a differential amplifier having a first input, a second input, and a ground input;
    (i) wherein said first input comprises a first input resistor coupled between said first signal input and said ground input, said first input resistor having a resistive value substantially equal to said first predetermined value;
    (ii) wherein said second input comprises a second input resistor coupled between said second signal input and said ground input, said second input resistor having a resistive value substantially equal to said second predetermined value;
    (iii) wherein a first end of said first signal conductor is coupled to said first signal input and a first end of said first ground conductor is coupled to said ground input; and
    (iv) wherein a first end of said second signal conductor is coupled to said second signal input and a first end of said second ground conductor is coupled to said ground input;
  (d) coupling a second end of said first signal conductor to a first test point and allowing a second end of said first ground conductor to be unreferenced with respect to ground; and
  (e) coupling a second end of said second signal conductor to a second test point and allowing a second end of said second ground conductor to be unreferenced with respect to ground.

26. The method of claim 25, said steps of providing a first transmission line and providing a second transmission line further comprising the steps of providing said first transmission line on a flexible substrate and providing said second transmission line said flexible substrate.

27. The method of claim 25 further comprising the step of at least partially enclosing said common substrate, said first transmission line, and said second transmission line in an over-mold.

28. An electrical test probe for sensing a plurality of electric signals and generating a differential signal, said electrical test probe comprising:
  (a) a common substrate;
  (b) a first transmission line on said common substrate, said first transmission line comprising a first signal conductor and a first ground conductor, said first transmission line having a characteristic impedance substantially equal to a first predetermined value;
  (c) a second transmission line on said common substrate, said second transmission line comprising a second signal conductor and a second ground conductor, said second transmission line having a characteristic impedance substantially equal to a second predetermined value; and
  (d) a differential amplifier having a first signal input, a second signal input, and a ground input;
    (i) wherein a first input resistor is coupled between said first signal input and said ground input, said first input resistor having a resistive value substantially equal to said first predetermined value;
    (ii) wherein a second input resistor is coupled between said second signal input and said ground input, said second input resistor having a resistive value substantially equal to said second predetermined value;
    (iii) wherein a first end of said first signal conductor is coupled to said first signal input and a first end of said first ground conductor is coupled to said ground input;
    (iv) wherein a first end of said second signal conductor is coupled to said second signal input and a first end of said second ground conductor is coupled to said ground input;
    (v) wherein a second end of said first signal conductor is coupled to a first test point;
    (vi) wherein a second end of said second signal conductor is coupled to a second test point; and
    (vii) wherein a second end of said first ground conductor and a second end of said second ground conductor do not have a common ground.

29. The electrical test probe of claim 28 wherein said common substrate is a flexible substrate.

30. The electrical test probe of claim 28 further comprising an over-mold at least partially enclosing said common substrate, said first transmission line, and said second transmission line.

31. A transmission line input structure for use with an electrical test probe, said electrical test probe for sensing a plurality of electric signals and generating a differential signal, said transmission line input structure comprising:
（a) a common substrate;
(b) a first transmission line on said common substrate, said first transmission line comprising a first signal conductor and a first ground conductor, said first transmission line having a characteristic impedance substantially equal to a first predetermined value;
(c) a second transmission line on said common substrate, said second transmission line comprising a second signal conductor and a second ground conductor, said second transmission line having a characteristic impedance substantially equal to a second predetermined value; and
(d) a differential amplifier having a first signal input, a second signal input, and a ground input;
  (i) wherein a first input resistor is coupled between said first signal input and said ground input, said first input resistor having a resistive value substantially equal to said first predetermined value;
  (ii) wherein a second input resistor is coupled between said second signal input and said ground input, said second input resistor having a resistive value substantially equal to said second predetermined value;
  (iii) wherein a first end of said first signal conductor is coupled to said first signal input and a first end of said first ground conductor is coupled to said ground input;
  (iv) wherein a first end of said second signal conductor is coupled to said second signal input and a first end of said second ground conductor is coupled to said ground input;
  (v) wherein a second end of said first signal conductor is coupled to a first test point;
  (vi) wherein a second end of said second signal conductor is coupled to a second test point; and
  (vii) wherein a second end of said first ground conductor and a second end of said second ground conductor do not have a common ground.

32. The transmission line input structure of claim 31 wherein said common substrate is a flexible substrate.

33. The transmission line input structure of claim 31 further comprising an over-mold at least partially enclosing said common substrate, said first transmission line, and said second transmission line.

34. A method for sampling a plurality of electrical signals in a circuit and generating a differential signal, said method comprising the steps of:
(a) providing a first transmission line on a common substrate, said first transmission line comprising a first signal conductor and a first ground conductor, said first transmission line having a characteristic impedance substantially equal to a first predetermined value;
(b) providing a second transmission line on said common substrate, said second transmission line comprising a second signal conductor and a second ground conductor, said second transmission line having characteristic impedance substantially equal to a second predetermined value;
(c) providing a differential amplifier having a first input, a second input, and a ground input;
  (i) wherein said first input comprises a first input resistor coupled between said first signal input and said ground input, said first input resistor having a resistive value substantially equal to said first predetermined value;
  (ii) wherein said second input comprises a second input resistor coupled between said second signal input and said ground input, said second input resistor having a resistive value substantially equal to said second predetermined value;
  (iii) wherein a first end of said first signal conductor is coupled to said first signal input;
  (iv) wherein a first end of said second signal conductor is coupled to said second signal input; and
  (v) wherein a second end of said first ground conductor and a second end of said second ground conductor do not have a common ground;
(d) coupling a second end of said first signal conductor to a first test point and allowing a second end of said first ground conductor to be unreferenced with respect to ground; and
(e) coupling a second end of said second signal conductor to a second test point and allowing a second end of said second ground conductor to be unreferenced with respect to ground.

35. The method of claim 34, said steps of providing a first transmission line and providing a second transmission line further comprising the steps of providing said first transmission line on a flexible substrate and providing said second transmission line said flexible substrate.

36. The method of claim 34 further comprising the step of at least partially enclosing said common substrate, said first transmission line, and said second transmission line in an over-mold.

37. A differential electrical test probe tip for sensing a plurality of electric signals and transmitting said electrical signals to a differential amplifier for generation of a differential signal, said differential amplifier having a first signal input and a second signal input, said differential electrical test probe tip comprising:
(a) an elongate common substrate having a first substrate end and a second substrate end;
(b) a first signal test point and a second signal test point at said first substrate end;
(c) a first transmission line on said common substrate connecting said first signal test point to said first signal input, said first transmission line comprising a first signal conductor and a first ground conductor, said first transmission line having a characteristic impedance substantially equal to a first predetermined value;
(d) a second transmission line on said common substrate connecting said second signal test point to said second signal input, said second transmission line comprising a second signal conductor and a second ground conductor, said second transmission line having a characteristic impedance substantially equal to a second predetermined value; and
(e) said first predetermined value substantially equal to a second predetermined value.

38. The differential electrical test probe tip of claim 37 wherein said common substrate is a flexible substrate.

39. The differential electrical test probe tip of claim 37 further comprising an over-mold at least partially enclosing said common substrate, said first transmission line, and said second transmission line.

40. The differential electrical test probe tip of claim 37 wherein said over-mold has at least one gap defined therein to expose said first transmission line and said second transmission line.

41. A transmission line input structure for use with an electrical test probe, said electrical test probe for sensing a plurality of electric signals and transmitting said electrical signals to a differential amplifier for generation of a differential signal, said differential amplifier having a first signal input and a second signal input, said transmission line input structure comprising:
  (a) an elongate common substrate having a first substrate end and a second substrate end;
  (b) a first signal test point and a second signal test point at said first substrate end;
  (c) a first transmission line on said common substrate connecting said first signal test point to said first signal input, said first transmission line comprising a first signal conductor and a first ground conductor, said first transmission line having a characteristic impedance substantially equal to a first predetermined value;
  (d) a second transmission line on said common substrate connecting said second signal test point to said second signal input, said second transmission line comprising a second signal conductor and a second ground conductor, said second transmission line having a characteristic impedance substantially equal to a second predetermined value; and
  (e) said first predetermined value substantially equal to a second predetermined value.

42. The transmission line input structure of claim 41 wherein said common substrate is a flexible substrate.

43. The transmission line input structure of claim 41 further comprising an over-mold at least partially enclosing said common substrate, said first transmission line, and said second transmission line.

44. The transmission line input structure of claim 41 wherein said over-mold has at least one gap defined therein to expose said first transmission line and said second transmission line.

* * * * *

UNITED STATES PATENT AND TRADEMARK OFFICE
CERTIFICATE OF CORRECTION

PATENT NO.         : 7,019,544 B1
APPLICATION NO. : 10/995801
DATED                 : March 28, 2006
INVENTOR(S)       : Jacobs et al.

It is certified that error appears in the above-identified patent and that said Letters Patent is hereby corrected as shown below:

Title Page,
Item (57), Please amend the abstract to read as follows:
-- A differential electrical test probe tip for sensing a plurality of electric signals and generating a differential signal including an elongate common substrate having two signal test points at one end and a differential amplifier at the second end. Two transmission lines are on the common substrate, each connecting a respective signal test point and a signal input of the differential amplifier. The characteristic impedances of the two transmission lines are substantially equal. In one preferred embodiment, the common substrate is a flexible substrate. In one preferred embodiment an over-mold, which may have gaps therein, at least partially encloses the common substrate, the first transmission line, and the second transmission line. --

Column 2,
Line 30, "having a two signal" should read -- having two signal --; and
Line 33, "test point a signal" should read -- test point and a signal --.

Column 4,
Line 24, "capacitor $C_L$ that" should read -- capacitor $C_I$ that --.

Column 6,
Line 28, "resistors$R_{I+}$ $R_I$ first should read -- resistors$R_{I+}$, $R_{I-}$, first --.

Column 7,
Line 32, "resistor RLT" should read -- resistor $R_{LT}$ --;
Line 42, "at and end near" should read -- at an end near --; and
Line 59, "at an end of opposite the" should read -- at an end opposite the --.

Column 8,
Line 26-7, "arrives at the other amplifier" should read -- arrives at the other amplifier --;
Line 45, "show a the test probe tip" should read -- show the test probe tip --; and
Line 61, "430 may be, any type" should read -- 430 may be any type --.

Column 9,
Line 35, "slightly difference dielectric" should read -- slightly different dielectric --; and
Line 58, "electromagnetic Interference (EMI)" should read -- electromagnetic interference (EMI) --.

Column 10,
Line 7, "a users fingers" should read -- a user's fingers --.

UNITED STATES PATENT AND TRADEMARK OFFICE
CERTIFICATE OF CORRECTION

PATENT NO. : 7,019,544 B1
APPLICATION NO. : 10/995801
DATED : March 28, 2006
INVENTOR(S) : Jacobs et al.

It is certified that error appears in the above-identified patent and that said Letters Patent is hereby corrected as shown below:

<u>Column 14,</u>
Line 5, "line said flexible" should read -- line on said flexible --.

<u>Column 16,</u>
Line 7, "line said flexible" should read -- line on said flexible --.

<u>Column 18,</u>
Line 21, "line said flexible" should read -- line on said flexible --.

<u>Column 20,</u>
Line 31, "line said flexible" should read -- line on said flexible --.

Signed and Sealed this

Twelfth Day of December, 2006

JON W. DUDAS
*Director of the United States Patent and Trademark Office*